US011239183B2

(12) United States Patent
Sinha et al.

(10) Patent No.: US 11,239,183 B2
(45) Date of Patent: Feb. 1, 2022

(54) MITIGATING THERMAL-MECHANICAL STRAIN AND WARPAGE OF AN ORGANIC LAMINATE SUBSTRATE

(71) Applicant: International Business Machines Corporation, Armonk, NY (US)

(72) Inventors: Tuhin Sinha, Oradell, NJ (US); Krishna R. Tunga, Wappingers Falls, NY (US); Brian W. Quinlan, Poughkeepsie, NY (US); Charles Leon Arvin, Poughkeepsie, NY (US); Steven Paul Ostrander, Poughkeepsie, NY (US); Thomas Weiss, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/779,529

(22) Filed: Jan. 31, 2020

(65) Prior Publication Data
US 2021/0242139 A1 Aug. 5, 2021

(51) Int. Cl.
| | | |
|---|---|---|
| *H01L 23/00* | (2006.01) | |
| *H01L 23/367* | (2006.01) | |
| *H01L 23/16* | (2006.01) | |
| *H01L 23/14* | (2006.01) | |
| *H01L 21/48* | (2006.01) | |
| *H01L 23/66* | (2006.01) | |
| *H01L 23/538* | (2006.01) | |

(52) U.S. Cl.
CPC ........ *H01L 23/562* (2013.01); *H01L 21/4853* (2013.01); *H01L 23/145* (2013.01); *H01L 23/16* (2013.01); *H01L 23/3675* (2013.01); *H01L 23/5381* (2013.01); *H01L 23/66* (2013.01); *H01L 2223/6666* (2013.01)

(58) Field of Classification Search
CPC ....... H01L 23/16; H01L 23/66; H01L 23/145; H01L 23/562; H01L 23/3675; H01L 23/5381; H01L 21/4853; H01L 2223/6666
See application file for complete search history.

(56) References Cited

U.S. PATENT DOCUMENTS

| | | |
|---|---|---|
| 6,222,246 B1 | 4/2001 | Mak et al. |
| 6,472,762 B1 | 10/2002 | Kutlu |
| 6,528,892 B2 | 3/2003 | Caletka et al. |
| 7,009,307 B1 | 3/2006 | Li et al. |
| 7,266,788 B2 | 9/2007 | Haridass et al. |
| 7,375,288 B1 | 5/2008 | Ch'ng et al. |
| 7,504,718 B2 | 3/2009 | Gaynes et al. |
| 8,598,698 B1 | 12/2013 | Lim |

(Continued)

FOREIGN PATENT DOCUMENTS

WO 2018052413 3/2018

*Primary Examiner* — Peniel M Gumedzoe
(74) *Attorney, Agent, or Firm* — L. Jeffrey Kelly; Otterstedt, Wallace & Kammer, LLP

(57) ABSTRACT

A multi-chip module (MCM) package includes an organic laminate substrate; first and second semiconductor device chips that are mounted to a top side of the substrate and that define a chip gap region between opposing edges of the chips; and a stiffener that is embedded in the bottom side of the substrate. The stiffener extends across a stiffening region, which underlies the chip gap region, and does not protrude beyond a bottom side metallization of the substrate.

18 Claims, 6 Drawing Sheets

(56) References Cited

U.S. PATENT DOCUMENTS

| | | |
|---|---|---|
| 9,089,052 B2 | 7/2015 | Li et al. |
| 9,478,500 B2 | 10/2016 | Chen et al. |
| 9,478,504 B1 | 10/2016 | Shen et al. |
| 9,552,977 B2 | 1/2017 | Roy et al. |
| 10,373,893 B2 * | 8/2019 | Vaidya .............. H01L 21/76898 |
| 2008/0128897 A1 | 6/2008 | Chao |
| 2008/0239685 A1 * | 10/2008 | Kawabe .................. H01L 23/50 |
| | | 361/782 |
| 2009/0057884 A1 | 3/2009 | Too et al. |
| 2012/0127628 A1 * | 5/2012 | Lee ..................... C04B 35/6342 |
| | | 361/321.4 |
| 2012/0188721 A1 | 7/2012 | Ho et al. |
| 2014/0251658 A1 * | 9/2014 | Lin ...................... H05K 1/0206 |
| | | 174/252 |
| 2015/0022985 A1 * | 1/2015 | Na .......................... H01L 23/50 |
| | | 361/763 |
| 2016/0095209 A1 | 3/2016 | Starkston et al. |
| 2016/0172313 A1 | 6/2016 | Zhu et al. |
| 2016/0240481 A1 * | 8/2016 | Chen .................. H01L 23/5385 |
| 2018/0166373 A1 * | 6/2018 | Lin ...................... H05K 3/4602 |

\* cited by examiner

MITIGATING THERMAL-MECHANICAL STRAIN AND WARPAGE OF AN ORGANIC LAMINATE SUBSTRATE

BACKGROUND

The present invention relates to the electrical, electronic, and computer arts, and more specifically, to manufacturing multi-chip modules incorporating plural semiconductor wafers on an organic laminate substrate.

Multi-chip modules undergo thermal transients during their operation, in a manner known to the ordinary skilled worker. Such transients subject different regions of a multi-chip module (MCM) to differing thermal strains according to local temperatures and coefficients of thermal expansion (CTE). Differences in thermal strain throughout an MCM can produce warpage or resin cracking in the module, which in turn can impact the module's performance.

SUMMARY

Principles of the invention provide techniques for mitigating strain and warpage of an organic laminate substrate. In one aspect, an exemplary method includes providing a stiffener at a bottom side of an organic laminate substrate, wherein the stiffener extends across a stiffening region and does not protrude beyond a bottom side metallization of the substrate; fabricating a multi-chip module by mounting first and second chips to a top side of the substrate, wherein the first and second chips define a chip gap region between opposing edges thereof, and the chip gap region overlies the stiffening region; and then subjecting the multi-chip module to thermal-mechanical strain, wherein the stiffener mitigates the thermal-mechanical strain and warpage of the substrate.

In another aspect, an exemplary article of manufacture includes an organic laminate substrate; first and second semiconductor device chips that are mounted to a top side of the substrate and that define a chip gap region between opposing edges of the chips; and a stiffener that is embedded in the bottom side of the substrate. The stiffener extends across a stiffening region, which underlies the chip gap region, and does not protrude beyond a bottom side metallization of the substrate.

In yet another aspect, an exemplary method comprises providing an article of manufacture that includes an organic laminate substrate; first and second semiconductor device chips that are mounted to a top side of the substrate and that define a chip gap region between opposing edges of the chips; and a stiffener embedded in the bottom side of the substrate. The stiffener extends across a region that underlies the chip gap region, and does not protrude beyond a bottom side metallization of the substrate. The stiffener comprises a plurality of stiffener bars that are separated by inter-bar gaps, electrical connections between the chips are made through the inter-bar gaps, the stiffener includes at least one tooth that makes an electrical connection through the substrate to at least one of the chips, and the stiffener comprises a decoupling capacitor that is formed by laminating layers of ceramic and layers of adhesive within the region that underlies the chip gap region. The exemplary method further includes subjecting the article of manufacture to thermal mechanical strain; the stiffener mitigates the thermal mechanical strain and warpage of the substrate.

In view of the foregoing, techniques of the present invention can provide substantial beneficial technical effects. For example, one or more embodiments provide one or more of:

Reduced die-to-die spacing with comparable thermomechanical performance.

Elimination of the need to have a stiffening rib on the MCM lid.

Simplified lid design and concomitant reliability improvement and cost reduction.

Reduced module weight.

Reduced risk of tearing thermal interface material (TIM) at the inner die corners.

Reduced risk of resin cracking adjacent to the back-side metallization layer (BSM).

Added electrical functionality if the stiffening structures have active in-built circuitry (e.g., capacitors, inductors, or resistors).

These and other features and advantages of the present invention will become apparent from the following detailed description of illustrative embodiments thereof, which is to be read in connection with the accompanying drawings.

DETAILED DESCRIPTION

As mentioned, variations in temperature throughout a multi-chip module (MCM) can introduce thermal strains, which can lead to warpage or even cracking of components such as an organic laminate substrate to which chips are mounted. Generally, the temperature distribution is such that a bottom side of the substrate (away from the chips) is cooler than a top side (adjacent the chips). This means that typically the bottom side expands less as it is heated, so that the warpage curves the substrate concave toward the bottom side and so that the bottom side is prone to cracking.

Both warpage and cracking can be mitigated by modifying the bottom side of the substrate so that it resists the bending and tensile stress induced by uneven thermal distribution, and/or conforms to the expansion of the top side. For example, the bottom side could be made stiffer than the top side, or it could be made to expand by about the same amount as the top side even though it is at a lower temperature. Both approaches could be combined by altering the bottom side of the substrate to include a stiffener that has a greater elastic modulus and a somewhat higher coefficient of thermal expansion than does the top side of the substrate. For example, in an organic laminate substrate a metal stiffener could be provided at the bottom side in a region especially prone to warpage and/or cracking.

Figure 1:
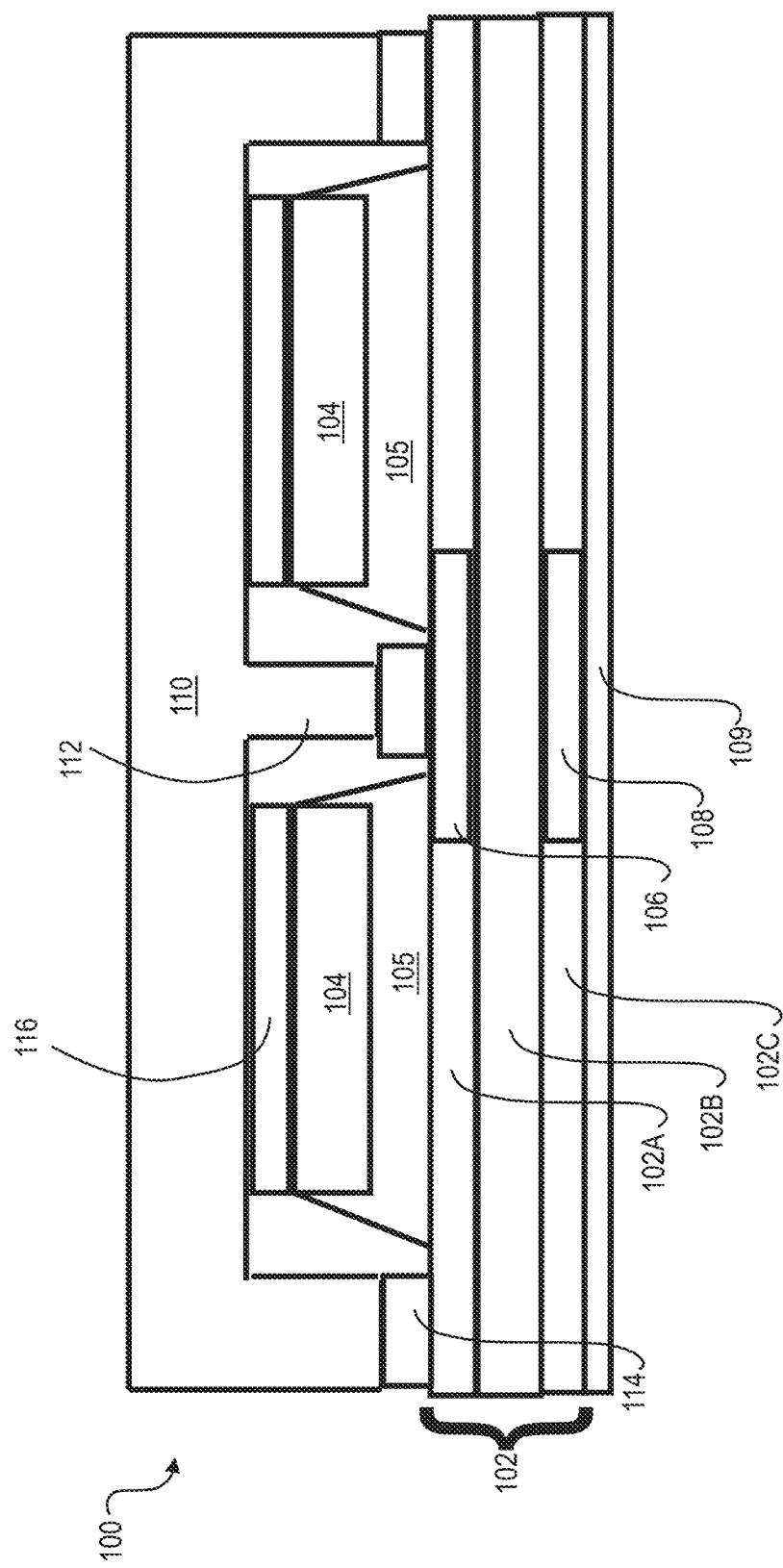
FIG. 1 depicts a side cutaway schematic view of a multi-chip module (MCM) package, according to an exemplary embodiment.
Figure 2:
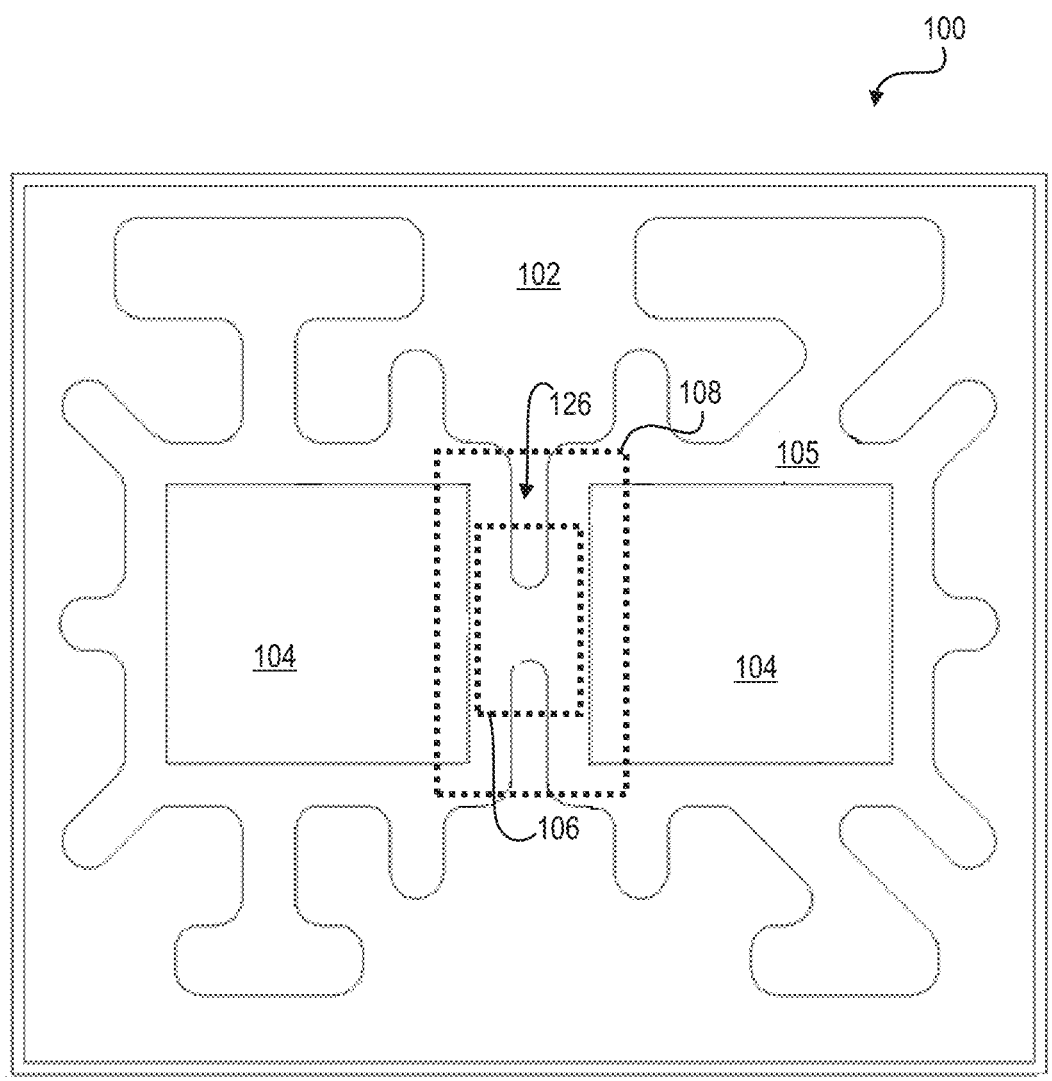
FIG. 2 depicts a top schematic view of the MCM package of FIG. 1.

Accordingly, FIG. 1 depicts a side cutaway schematic view of a multi-chip module (MCM) package 100, according to an exemplary embodiment. FIG. 2 depicts a top schematic view of the same MCM package 100. The MCM package 100 includes a substrate 102, generally an organic laminate substrate. Semiconductor device chips 104 are mounted at a top side 102A of the substrate 102 by underfill 105. In the top side 102A there is a silicon bridge 106, which electrically connects the chips 104. Covering the chips there is a lid 110. The lid 110 optionally includes a rib 112. Edges of the lid 110 are sealed to the substrate 102 by a seal 114. Typically, warpage of the substrate 102 increases a risk that the seal 114 will separate from the lid 110. A thermal interface material (TIM) 116 is pressed between the lid 110 and the chips 104 to enhance dissipation of heat from the chips through the lid. Typically, warpage of the substrate 102 increases a risk that the TIM 116 will tear, particularly at inner corners of the chips 104.

Figure 3:
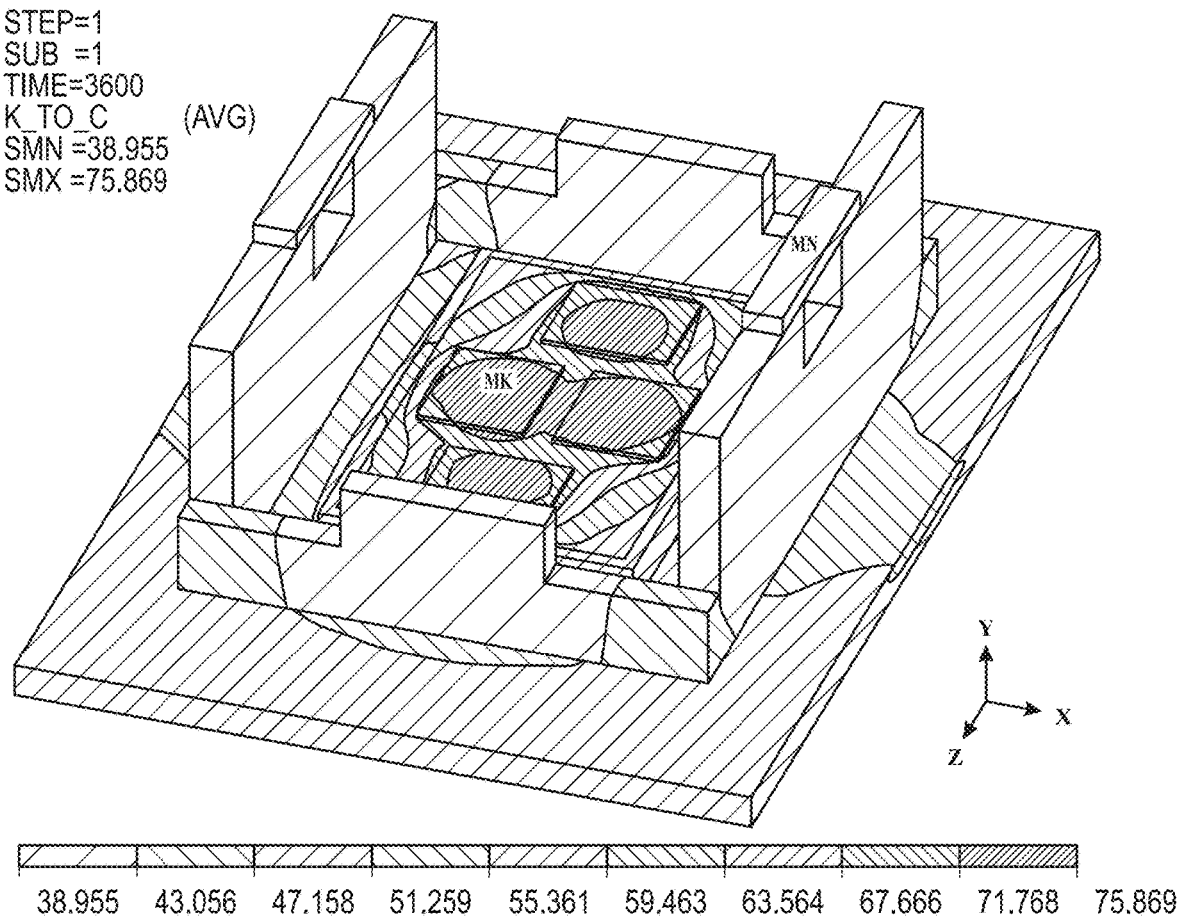
FIG. 3 depicts an exemplary temperature simulation of the MCM package of FIG. 1.

In operation, the chips 104 heat up and produce a temperature distribution in which the underfill 105 is at a relatively high temperature, the substrate top side 102A is at about the same temperature as the underfill, a midplane 102B of the substrate is at a somewhat lower temperature, and a bottom side 102C of the substrate is at the lowest temperature. A skilled modeler, using a program such as ANSYS® (a trademark of ANSYS, Inc.), can determine the temperature distribution within the module along with the accompanying stresses and strains. FIG. 3 depicts an exemplary ANSYS temperature simulation. However, for the current invention to work, the temperature distribution need not necessarily be non-uniform as described above. It will work even if the entire package is at the same temperature with the temperature being anywhere from −60 C to 225 C. While the substrate 102 generally has a coefficient of thermal expansion (CTE) of about 12 to about 20 parts per million (ppm) per ° C., the silicon bridge 106 typically has a lower CTE of about 2.6 ppm/° C. Therefore, although the portions of the top side 102A that are directly under the chips 104 expand to the greatest extent, the portion of the top side 102A that includes the silicon bridge 106 expands to a lesser extent. Meanwhile, the bottom side 102C, being the coolest portion of the substrate, expands even less. Without some modification of the substrate 102, the result, as mentioned above, would be that the substrate 102 tended to warp concave toward the bottom side 102C (causing separation of the TIM 116 from the chip 104 and/or separation of the seal 114 from the substrate 102) and also tended to crack at the bottom side. The intent of the lid rib 112 is to at least partly mitigate such separation.

In one or more embodiments, in order to mitigate warpage and cracking caused by thermal strains, a stiffener 108 is provided in the bottom side 102C. The stiffener 108 has about the same or a somewhat higher coefficient of thermal expansion than does the substrate 102 (generally, the CTEs are effectively matched within 25%), and also has a significantly higher elastic modulus. The substrate 102, which comprises an organic laminate material, typically would have CTE about 12-20 ppm/° C. as mentioned above, and elastic modulus about 20-25 GPa. The stiffener mitigates thermal-mechanical strain as follows: a) Resin strain is proportional to the curvature of the substrate. By being stiffer compared to the substrate, the stiffener disallows excessive local curvature in the region between the closely spaced chips, thereby reducing the resin strain in this region. b) By being CTE matched closely with respect to the substrate, the stiffener does not introduce additional local strain between the stiffener and the substrate. Therefore, it does not negate the decrease in resin strain that was achieved as explained in step a) above. For example, the stiffener 108 may comprise SS305 steel material (CTE about 17 ppm/° C.; elastic modulus about 193 GPa). A typical substrate could have a CTE between 12-19 ppm/C. So, a material with CTE within or near this range also will work. For example, SS405 (CTE 10.8 ppm/° C.; elastic modulus about 200 GPa) or SS410 (CTE 9.9 ppm/° C.; elastic modulus about 200 GPa) also can be used. Other suitable materials include copper (CTE about 17 ppm/° C.; elastic modulus about 110 GPa) or aluminum (CTE about 24 ppm/° C.; elastic modulus about 69 GPa).

Thus, provision of the stiffener 108 mitigates thermal strain that otherwise would cause warpage at the bottom side 102C. Additionally, provision of the stiffener 108 resists the tensile stress exerted on the bottom side 102C by the greater thermal expansion of the higher-temperature top side 102A and thereby mitigates cracking that otherwise could occur due to the thermal-mechanical strains within the substrate 102. Therefore, provision of the stiffener 108 makes it possible to do without the lid rib 112.

Figures 4, 5:
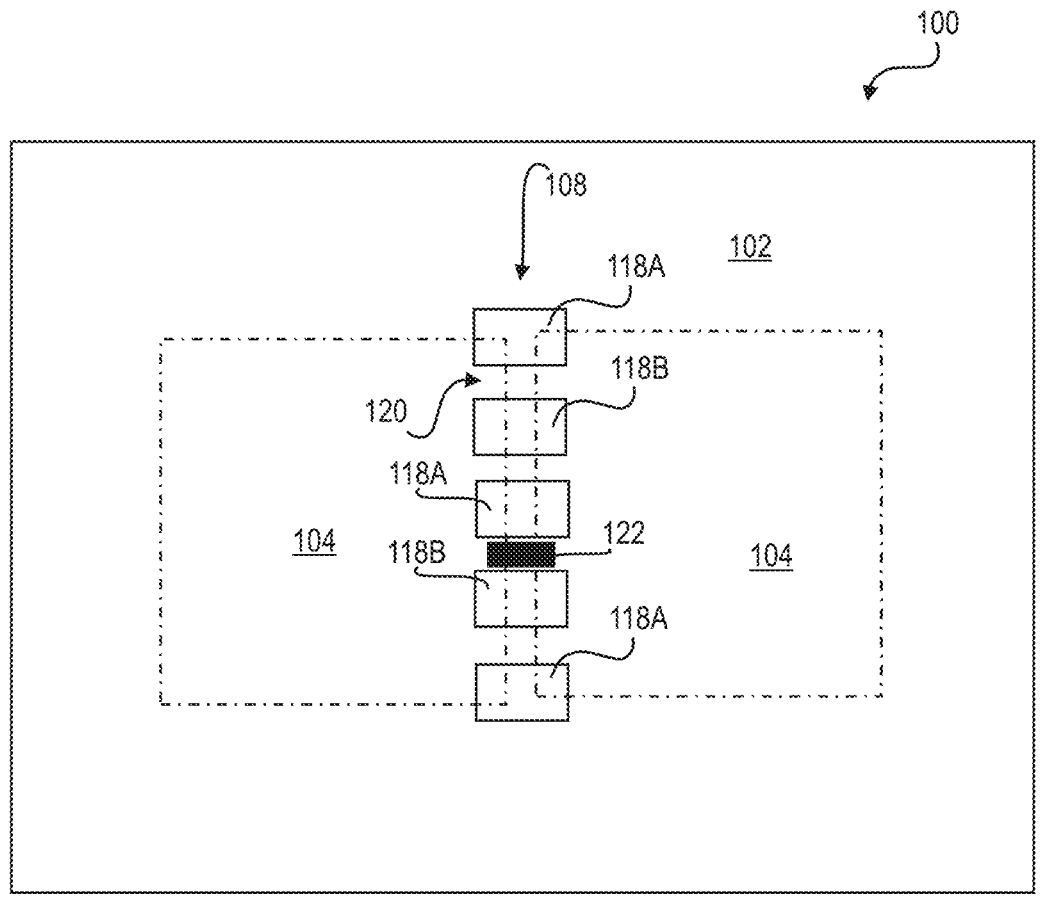
FIG. 4 depicts a bottom schematic view of an MCM package, according to an exemplary embodiment.
FIG. 5 depicts in a flowchart steps of a method for fabricating an MCM according to FIG. 1.

Advantageously, the stiffener 108 can provide electrical functionality as well as mechanical functionality. For example, in one or more embodiments the stiffener 108 can comprise one or more grounding bars 118A (as shown in FIG. 4) and/or it can comprise one or more decoupling capacitors 118B (as shown also in FIG. 4). In either case, the stiffener 108 is electrically connected to at least one of the chips 104, e.g., as discussed below with reference to FIG. 6.

The stiffener 108 can be embedded into the bottom side 102C of the substrate 102 in a variety of ways that will be apparent to an ordinary skilled worker in light of this disclosure.

For example, in an embodiment as shown in FIG. 1 the stiffener 108 can be placed in its final position during lamination of the substrate 102, in which case the organic resins of the substrate 102 adhere to and encapsulate the stiffener 108. FIG. 5 depicts steps of a method 400 for assembling the MCM package 100 according to the embodiment of FIG. 1. At 402, the method includes embedding the stiffener 108 at the bottom side 102C of the organic laminate substrate 102. The stiffener 108 defines a stiffening region of the substrate 102 and does not protrude beyond a bottom side metallization 109 of the substrate 102. At 404, the method includes fabricating a multi-chip module 101 by mounting first and second chips 104 to a top side 102A of the substrate 102. The first and second chips 104 define a chip gap region 126 (seen in FIG. 2) between opposing edges thereof, and the chip gap region 126 overlies the stiffening region.

Figure 6:
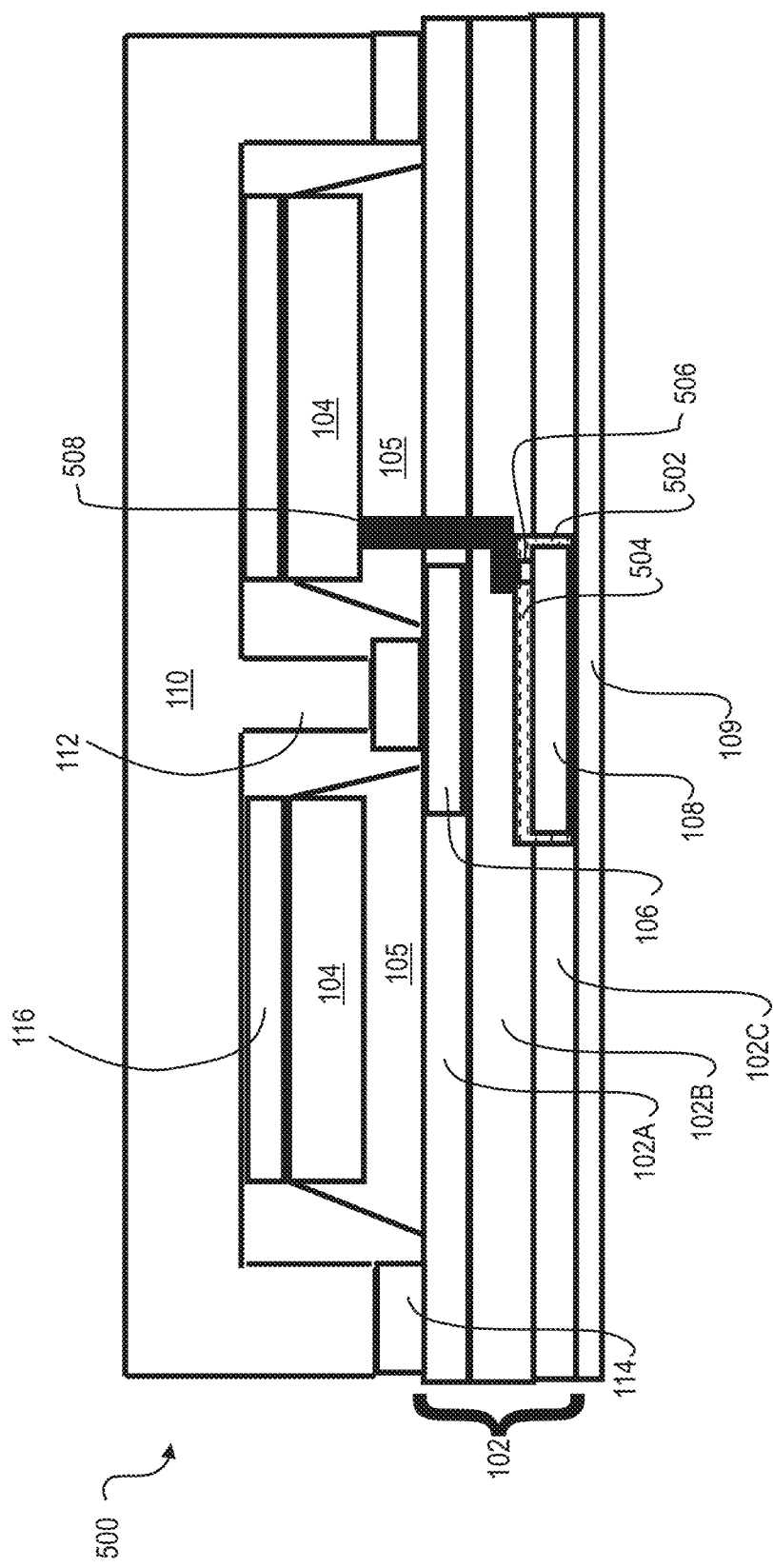
FIG. 6 depicts a side cutaway schematic view of an MCM according to an exemplary embodiment.

Alternatively, in another embodiment 500 as shown in FIG. 6 the substrate 102 can be formed with an indentation 502 to receive the stiffener 108 after formation of the substrate. In this latter case, an adhesive 504 (also shown in FIG. 6) can be deposited into the indentation 502, then the stiffener 108 can be pressed into the adhesive 504. In embodiments in which the stiffener 108 provides electrical functionality, it is pressed into the adhesive 504 with sufficient pressure so that a tooth 506 of the stiffener (also shown in FIG. 6) makes electrical contact with a via and interconnect 508, formed in the substrate 102; the via and interconnect 508 are in electrical communication with one of the chips 104.

Figure 7:
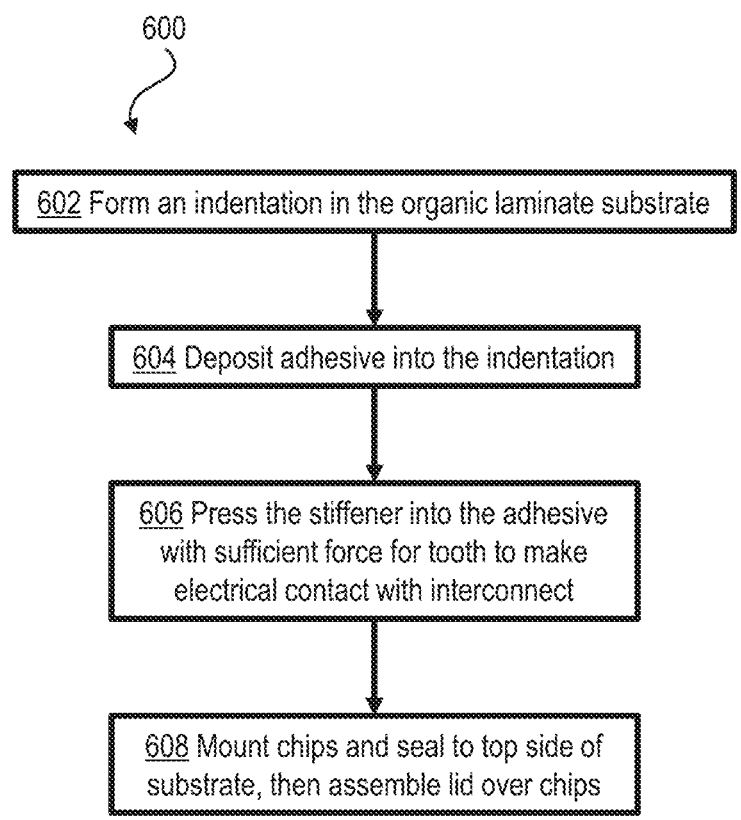
FIG. 7 depicts in a flowchart steps of a method for fabricating an MCM according to FIG. 5.

FIG. 7 depicts steps of a method 600 for assembling the MCM package 100 according to the embodiment of FIG. 6. At 602, the method includes forming the indentation 502 in the substrate 102. At 604, deposit the adhesive 504 into the indentation 502. At 606, press the stiffener 108 into the adhesive 504 with sufficient pressure for the tooth 506 of the stiffener 108 to make electrical contact with the via 508. At 608, fabricate the multi-chip module by mounting chips 104 and seal 114 to the top side of the substrate 102, then assembling the lid 110 over the chips.

Referring again to FIG. 4, the stiffener 108 does not have to be a unitary structure. Indeed, in one or more embodiments the stiffener 108 can comprise a plurality of smaller stiffener bars 118A, 118B that are separated by one or more inter-bar gaps 120. In such embodiments, advantageously, electrical connections 122 between the chips 104 can be made through the inter-bar gaps 120. For example, the electrical connections 122 could be made by portions of the silicon bridge 106 in an embodiment in which the silicon bridge 106 is a multi-piece bridge that vertically overlaps the stiffener 108.

Considering FIGS. 2 and 3, the stiffener 108 fills a stiffening region of the bottom side 102C that corresponds to a chip gap region 126 defined between the chips 104. However, the stiffener 108 does not need to be coextensive with the chip gap region 126. As in FIG. 2, the stiffener 108 can extend beyond the chip gap region 126, and in particular can extend beyond the edges of the chips 104. This extra length of the stiffener 108 can help to mitigate strains in cases where additional electronic components (not shown) are attached to the substrate 102 alongside the chips 104. Alternatively, as in FIG. 4, the stiffener 108 can cover only parts of the chip gap region 126, i.e. the stiffener 108 can be broken into multiple stiffener bars 118A, 118B.

Given the discussion thus far, it will be appreciated that, in general terms, an exemplary method 400 or 600, according to an aspect of the invention, includes at 402 or 606 providing a stiffener at a bottom side of an organic laminate substrate, wherein the stiffener extends across a stiffening region and does not protrude beyond a bottom side metallization of the substrate; at 404 or 608 fabricating a multi-chip module by mounting first and second chips to a top side of the substrate, wherein the first and second chips define a chip gap region between opposing edges thereof, and the chip gap region overlies the stiffening region; and then subjecting the multi-chip module to thermal-mechanical strain. The stiffener mitigates the thermal-mechanical strain and warpage of the substrate. In one or more embodiments, the stiffener is effectively matched to the substrate in coefficient of thermal expansion. In one or more embodiments, the stiffener is rectangular in shape and is coextensive with the chip gap region. In one or more embodiments, the stiffener extends beyond ends of the chip gap region. In one or more embodiments, the stiffener comprises a plurality of stiffener bars that are separated by at least one inter-bar gap, and the method also includes making electrical connections between the chips through the at least one inter-bar gap. In one or more embodiments, the stiffener is provided by forming the organic laminate around the stiffener. In one or more embodiments, the stiffener is provided by indenting the substrate, depositing an adhesive into the indentation in the substrate, and placing the stiffener into the indentation with sufficient pressure to displace the adhesive at contact points between the stiffener and circuitry of the substrate. In one or more embodiments, the method also includes making an electrical connection to the stiffener from at least one of the chips through the substrate. In one or more embodiments, the stiffener comprises a decoupling capacitor. In one or more embodiments, the stiffener is formed by laminating layers of ceramic and layers of adhesive within the stiffening region organic laminate substrate.

According to another aspect, an exemplary article of manufacture 100 includes an organic laminate substrate 102; first and second semiconductor device chips 104 that are mounted to a top side 102A of the substrate and that define a chip gap region 126 between opposing edges of the chips; and a stiffener 108 that is embedded in the bottom side of the substrate. The stiffener extends across a stiffening region, which underlies the chip gap region, and does not protrude beyond a bottom side metallization 109 of the substrate. In one or more embodiments, the stiffener is embedded into the substrate during deposition of the organic laminate to form the substrate. In one or more embodiments, the stiffener is adhered into an indentation formed in the organic laminate of the substrate, and includes at least one tooth that penetrates the adhesive to make an electrical connection through the substrate to at least one of the chips. In one or more embodiments, the stiffener is coextensive with the chip gap region. In one or more embodiments, the stiffener comprises a plurality of stiffener bars 118A, 118B that are separated by at least one inter-bar gap 120, wherein at least one silicon bridge 106 forms an electrical connection 122 between the chips through the at least one inter-bar gap. In one or more embodiments, an electrical connection is made to the stiffener from at least one of the chips through the substrate. In one or more embodiments, the stiffener comprises a decoupling capacitor. In one or more embodiments, the stiffener comprises a grounding bar.

According to another aspect, an exemplary method comprises providing an article of manufacture 100 that includes an organic laminate substrate 102; first and second semiconductor device chips 104 that are mounted to a top side 102A of the substrate and that define a chip gap region 126 between opposing edges of the chips; and a stiffener 108 embedded in the bottom side 102C of the substrate. The stiffener 108 extends across a region that underlies the chip gap region 126, and does not protrude beyond a bottom side metallization 109 of the substrate. The stiffener comprises a plurality of stiffener bars 118B that are separated by inter-bar gaps 120, electrical connections 122 between the chips 104 are made through the inter-bar gaps, the stiffener includes at least one tooth 506 that makes an electrical connection through the substrate 102 to at least one of the chips 104, and the stiffener comprises a decoupling capacitor 118B that is formed by laminating layers of ceramic and layers of adhesive within the region that underlies the chip gap region. The exemplary method further includes subjecting the article of manufacture to thermal mechanical strain; the stiffener mitigates the thermal mechanical strain and warpage of the substrate.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
    providing a stiffener at a bottom side of an organic laminate substrate by indenting the substrate, depositing an adhesive into the indentation in the substrate, and placing the stiffener into the indentation with sufficient pressure to displace the adhesive at contact points between the stiffener and circuitry of the substrate, wherein the stiffener extends across a stiffening region and does not protrude beyond a bottom side metallization of the substrate; and fabricating a multi-chip module by mounting first and second chips to a top side of the substrate, wherein the first and second chips define a chip gap region between opposing edges thereof, and the chip gap region overlies the stiffening region.

2. The method of claim 1 wherein the stiffener is effectively matched to the substrate in coefficient of thermal expansion.

3. The method of claim 1 wherein the stiffener is rectangular in shape and is coextensive with the chip gap region.

4. The method of claim 1 wherein the stiffener extends beyond ends of the chip gap region.

5. The method of claim 1 wherein the stiffener comprises a plurality of stiffener bars that are separated by at least one inter-bar gap, further comprising making electrical connections between the chips through the at least one inter-bar gap.

6. The method of claim 1 wherein the stiffener is provided by forming the organic laminate around the stiffener.

7. The method of claim 1 further comprising making an electrical connection to the stiffener from at least one of the chips through the substrate.

8. The method of claim 7 wherein the stiffener comprises a decoupling capacitor.

9. The method of claim 8 further comprising forming the stiffener by laminating layers of ceramic and layers of adhesive within the stiffening region of the organic laminate substrate.

10. The method of claim 9 wherein the stiffener comprises a plurality of stiffener bars that are separated by at least one inter-bar gap, further comprising making electrical connections between the chips through the at least one inter-bar gap.

11. An article of manufacture comprising:
an organic laminate substrate;
first and second semiconductor device chips mounted to a top side of the substrate and defining a chip gap region between opposing edges of the chips; and
a stiffener embedded in the bottom side of the substrate, wherein the stiffener extends across a stiffening region, which underlies the chip gap region, and does not protrude beyond a bottom side metallization of the substrate;
wherein the stiffener comprises a plurality of stiffener bars that are separated by at least one inter-bar gap, wherein at least one silicon bridge forms an electrical connection between the chips through the at least one inter-bar gap.

12. The article of claim 11 wherein the stiffener is embedded into the substrate during deposition of the organic laminate to form the substrate.

13. The article of claim 11 wherein the stiffener is adhered by an adhesive into an indentation formed in the organic laminate of the substrate, and includes at least one tooth that penetrates the adhesive to make an electrical connection through the substrate to at least one of the chips.

14. The article of claim 11 wherein the stiffener is coextensive with the chip gap.

15. The article of claim 11 wherein an electrical connection is made to the stiffener from at least one of the chips through the substrate.

16. The article of claim 15 wherein the stiffener comprises a decoupling capacitor.

17. The article of claim 15 wherein the stiffener comprises a grounding bar.

18. A method comprising:
providing an article of manufacture that comprises:
an organic laminate substrate;
first and second semiconductor device chips that are mounted to a top side of the substrate and that define a chip gap region between opposing edges of the chips; and
a stiffener embedded in the bottom side of the substrate, wherein the stiffener extends across a region that underlies the chip gap region and does not protrude beyond a bottom side metallization of the substrate,
wherein the stiffener comprises a plurality of stiffener bars that are separated by inter-bar gaps, electrical connections between the chips are made through the inter-bar gaps, the stiffener includes at least one tooth that makes an electrical connection through the substrate to at least one of the chips, and the stiffener comprises a decoupling capacitor that is formed by laminating layers of ceramic and layers of adhesive within the region that underlies the chip gap region; and
subjecting the article of manufacture to thermal mechanical strain, wherein the stiffener mitigates the thermal mechanical strain and warpage of the substrate.

* * * * *